United States Patent [19]

Hunter et al.

[11] 3,869,704

[45] Mar. 4, 1975

[54] SEMICONDUCTOR DEVICE WITH DISPERSED GLASS GETTER LAYER

[75] Inventors: William L. Hunter; Keith Gordon Spanjer, both of Scottsdale, Ariz.

[73] Assignee: Motorola, Inc., Chicago, Ill.

[22] Filed: Sept. 17, 1973

[21] Appl. No.: 398,909

[52] U.S. Cl. .......................... 357/54, 357/72, 357/78

[51] Int. Cl. .......................... H01l 11/00, H01l 15/00

[58] Field of Search ........... 317/234, 2, 3, 255, 46.5

[56] References Cited

UNITED STATES PATENTS

| | | | |
|---|---|---|---|
| 2,846,625 | 8/1958 | Gustafson | 317/234 D |
| 2,857,560 | 10/1958 | Schnable et al. | 317/234 D |
| 2,902,633 | 9/1959 | Durst et al. | 317/234 D |
| 2,998,556 | 8/1961 | Pritchard et al. | 317/234 D |
| 3,056,074 | 9/1962 | Fahey et al. | 317/234 D |
| 3,465,209 | 9/1969 | Denning et al. | 317/235 |
| 3,487,275 | 12/1969 | Perrin et al. | 317/234 D |
| 3,700,497 | 10/1972 | Epifano et al. | 317/235 E |

FOREIGN PATENTS OR APPLICATIONS

| | | | |
|---|---|---|---|
| 1,193,625 | 10/1959 | France | 317/234 D |

*Primary Examiner*—Andrew J. James
*Attorney, Agent, or Firm*—Vincent J. Rauner; Charles R. Hoffman

[57] ABSTRACT

A semiconductor device having at least one region of P conductivity type material and a second region of N conductivity type material defining a P-N junction therebetween and having electrically conductive terminals extending therefrom, is provided with a closure member that has a phosphorous-doped finely divided glass filler. The glass filler provides the closure member with a continuing getter capability.

2 Claims, 1 Drawing Figure

SEMICONDUCTOR DEVICE WITH DISPERSED GLASS GETTER LAYER

BACKGROUND OF THE INVENTION

This invention relates to semiconductor devices generally, and more particularly to semiconductor devices having packages protecting the devices against the deleterious effects of mobile ions and other particles on semiconductor surfaces.

Heretofore, various semiconductor devices, such as transistors, having P conductivity regions and N conductivity regions forming P-N junctions therebetween have been protected by applying a passivating layer, such as silicon dioxide, on a surface of the body of semiconductor material at which the P-N junctions terminate. Such a passivating layer substantially improves the performance of the semiconductor device, particularly a silicon device. The stability of the operating characteristics of a device is also known to be further improved by diffusing beneficial impurities into the semiconductor material and its passivating layer. A common example of this stabilization is a phosphorous diffusion performed as one of the final high temperature operations in the device fabrication. For a phosphorous diffusion to effectively stabilize a semiconductor device, it has been necessary to diffuse a relatively high concentration of phosphorous into the exposed surface of the passivating layer. The final high temperature operation is performed at about 1,150°C to 1,250° C. Using this prior art technique, the gettering action is completed by this high temperature step. Thereafter, unwanted sodium ions and the like may prove troublesome at the junction points.

U.S. Pat. No. 3,476,619, assigned to the assignee of this invention teaches a prior art passivation technique that is an improvement over the above-described prior art. A layer of silicon dioxide including, preferably, phosphorous is deposited on a body of semiconductor material and a passivating layer thereon at a low temperature. Then the device is heated and the phosphorous redistributed in the deposited silicon dioxide and the passivating layer of silicon dioxide. This process can be carried out at a substantially lower temperature and therefore does away with some inherent problems of the above-mentioned high temperature step, but still does not provide the continual gettering action of applicants' invention.

BRIEF DESCRIPTION

Accordingly, it is a primary object of this invention to provide a package for a semiconductor device which includes means for continually providing a gettering capability.

A further object of this invention is to provide a semiconductor device having a closure member including a plastic die-coat having a continuous gettering capability.

In accordance with a further object of the invention, the closure member is a plastic, filled with a phosphorous-doped finely divided glass.

In accordance with these objects there is provided a semiconductor package comprising at least one P-N junction which is protected by a closure member, the closure member being a plastic die-coat or a plastic encapsulant, or both having a phosphorous-doped finely divided glass filler.

THE DRAWING

Further objects and advantages of the invention will be apparent to one skilled in the art from the following complete specification and the drawing wherein the FIGURE is a cross-section of a semiconductor device in accordance with the preferred embodiment of the invention.

DETAILED DESCRIPTION

Figure 1:
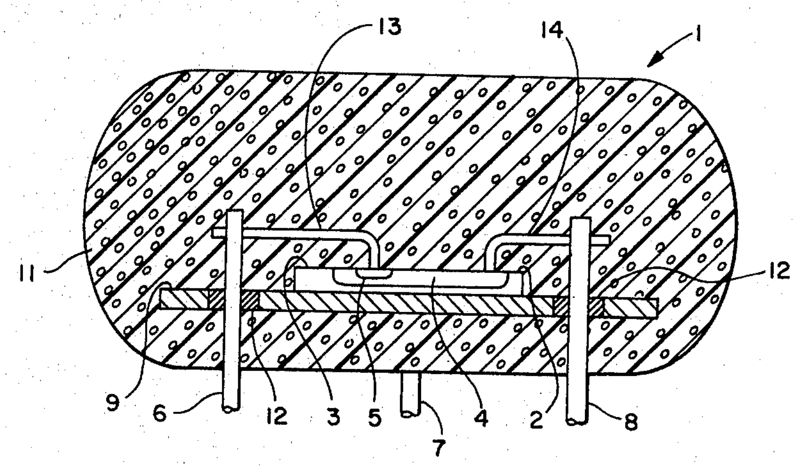

As shown in the FIGURE, a semiconductor device 1 comprises a semiconductor chip 2, which chip has P and N doped semiconductor regions therein defining P-N junctions and providing, for example, a collector, base and emitter region 3, 4 and 5. Semiconductor chip, or die, 2 is completely enclosed in a housing for providing continuous gettering action which includes terminals 6, 7, and 8 for electrical connection outside of the device. The housing includes a header 9 and an encapsulant 11 which is preferably a plastic having a phosphorous-doped finely divided glass filler. The header 9, preferably being of metallic conductive material, is insulated from terminals 6 and 8 by an insulative sealing means 12. The emitter 5 and base 4 of the transistor are respectively connected to the terminals 6 and 8 by lead wires 13 and 14. The transistor chip or die 2 is bonded to the header 9 and the terminal 7 is electrically connected to the header 9 to provide electrical connection to the collector 3 of the transistor.

The semiconductor package shown is a comparatively standard package which is completely surrounded by the encapsulant 11 which serves to protect the semiconductor die or chip 2 from the harmful effects of mobile ions and other particles.

This relatively standard package may be assembled in conventional manner and then the encapsulant 11 applied by standard dipping, potting or molding methods.

The transistor chip 2 is normally bonded to the header 9 by gold or gold alloy material and the lead wires 13 and 14 are normally of gold. Encapsulant 11 is a plastic and the filler is typically finely divided particles of phosphorous-doped silicon dioxide. It is important that the encapsulant 11 contact the chip or die 2, particularly in the area of the junctions. An alternate construction is one wherein a thin polymeric die-coat layer having the phosphorous-doped glass filler is in contact with the die or chip 2 with the encapsulant 11 over the die-coat, encapsulant 11 being filled with the phosphorous-doped glass or not, as desired.

The drawing illustrates a semiconductor device of a particular type, but only for illustrative purposes. This invention, of course, applies to all types of semiconductive devices including integrated circuits of all types, hybrid circuits and any other circuits which are subject to this general type of encapsulant protection. Those with ordinary skill in the art realize that the preferred embodiment shown discloses the invention but suitable modifications may be made without departing from the spirit and scope of the invention.

We claim:

1. A semiconductor device having a body of semiconductor material having at least one region of P conductivity and a second conductivity of N conductivity type defining a P-N junction therebetween, having electrically conductive terminals extending therefrom, and having a closure member, the closure member surrounding the body of semiconductor material and being comprised of plastic having a phosphorous-doped finely divided glass filler.

2. The semiconductor device of claim 1 wherein the closure member comprises a plastic encapsulant.

* * * * *